(12) United States Patent
Maxwell

(10) Patent No.: US 8,389,375 B2
(45) Date of Patent: Mar. 5, 2013

(54) MEMORY CELL FORMED USING A RECESS AND METHODS FOR FORMING THE SAME

(75) Inventor: Steven Maxwell, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 284 days.

(21) Appl. No.: 12/703,907

(22) Filed: Feb. 11, 2010

(65) Prior Publication Data

US 2011/0193042 A1   Aug. 11, 2011

(51) Int. Cl.
  *H01L 29/93* (2006.01)
  *G11C 11/21* (2006.01)
(52) U.S. Cl. ......................... 438/397; 438/255
(58) Field of Classification Search .................. None
  See application file for complete search history.

(56) References Cited

U.S. PATENT DOCUMENTS

| | | | |
|---|---|---|---|
| 4,599,705 A | 7/1986 | Holmberg et al. |
| 5,406,509 A | 4/1995 | Ovshinsky et al. |
| 5,687,112 A | 11/1997 | Ovshinsky |
| 5,751,012 A | 5/1998 | Wolsteinholme et al. |
| 5,825,046 A | 10/1998 | Czubatyj et al. |
| 5,831,276 A | 11/1998 | Gonzalez et al. |
| 5,915,167 A | 6/1999 | Leedy |
| 5,952,671 A | 9/1999 | Reinberg et al. |
| 6,071,597 A | 6/2000 | Yang et al. |
| 6,100,193 A | 8/2000 | Suehiro et al. |
| 6,114,713 A | 9/2000 | Zahorik |
| 6,214,107 B1 | 4/2001 | Kitabatake |
| 6,369,431 B1 | 4/2002 | Gonzalez et al. |
| 6,388,933 B2 | 5/2002 | Marr |
| 6,563,220 B2 | 5/2003 | Gonzalez et al. |
| 6,643,159 B2 | 11/2003 | Fricke et al. |
| 6,670,713 B2 | 12/2003 | Gonzalez et al. |
| 6,744,088 B1 | 6/2004 | Dennison |
| 6,841,846 B1 | 1/2005 | Chen et al. |
| 6,885,021 B2 | 4/2005 | Apodaca et al. |
| 6,937,507 B2 | 8/2005 | Chen |
| 6,952,030 B2 | 10/2005 | Herner |
| 6,960,495 B2 | 11/2005 | Vyvoda et al. |
| 6,984,561 B2 | 1/2006 | Herner et al. |
| 6,995,422 B2 | 2/2006 | Herner et al. |
| 7,009,275 B2 | 3/2006 | Herner et al. |
| 7,026,212 B2 | 4/2006 | Herner et al. |

(Continued)

FOREIGN PATENT DOCUMENTS

| EP | 0 028 707 | 5/1981 |
|---|---|---|
| EP | 1 892 722 | 2/2008 |

(Continued)

OTHER PUBLICATIONS

International Search Report and Written Opinion of International Application No. PCT/US2011/022096 dated Apr. 27, 2011.

(Continued)

*Primary Examiner* — Zandra Smith
*Assistant Examiner* — Pamela E Perkins
(74) *Attorney, Agent, or Firm* — Dugan & Dugan, PC

(57) ABSTRACT

In a first aspect, a method of forming a memory cell is provided, the method including: (1) forming a pillar above a substrate, the pillar comprising a steering element and a metal hardmask layer; (2) selectively removing the metal hardmask layer to create a void; and (3) forming a carbon-based switching material within the void. Numerous other aspects are provided.

23 Claims, 14 Drawing Sheets

U.S. PATENT DOCUMENTS

| | | |
|---|---|---|
| 7,084,062 B1 | 8/2006 | Avanzino et al. |
| 7,176,064 B2 | 2/2007 | Herner |
| 7,205,562 B2 | 4/2007 | Wicker |
| 7,238,607 B2 | 7/2007 | Dunton et al. |
| 7,259,038 B2 | 8/2007 | Scheuerlein |
| 7,265,049 B2 | 9/2007 | Herner et al. |
| 7,271,440 B2 | 9/2007 | Harshfield |
| 7,285,464 B2 | 10/2007 | Herner et al. |
| 7,301,191 B1 | 11/2007 | Tombler et al. |
| 7,345,296 B2 | 3/2008 | Tombler, Jr. et al. |
| 7,361,586 B2 | 4/2008 | Adem et al. |
| 7,405,465 B2 | 7/2008 | Herner |
| 7,417,245 B2 | 8/2008 | Happ et al. |
| 7,426,128 B2 | 9/2008 | Scheuerlein |
| 7,483,285 B2 | 1/2009 | Furukawa et al. |
| 7,575,984 B2 | 8/2009 | Radigan |
| 7,602,042 B2 | 10/2009 | Ahn et al. |
| 7,705,343 B2 | 4/2010 | Suh et al. |
| 7,728,405 B2 | 6/2010 | Kreupl |
| 8,039,919 B2 | 10/2011 | Moon et al. |
| 8,206,995 B2 | 6/2012 | Reyes et al. |
| 2003/0073295 A1 | 4/2003 | Xu |
| 2004/0159835 A1 | 8/2004 | Krieger et al. |
| 2004/0251551 A1 | 12/2004 | Hideki |
| 2005/0052915 A1 | 3/2005 | Herner et al. |
| 2005/0158950 A1 | 7/2005 | Scheuerlein et al. |
| 2005/0226067 A1 | 10/2005 | Herner et al. |
| 2006/0046407 A1 | 3/2006 | Juengling |
| 2006/0097342 A1 | 5/2006 | Parkinson |
| 2006/0118782 A1 | 6/2006 | Zettl et al. |
| 2006/0175596 A1 | 8/2006 | Happ et al. |
| 2006/0250836 A1 | 11/2006 | Herner |
| 2006/0258109 A1 | 11/2006 | Juengling |
| 2006/0273298 A1 | 12/2006 | Petti |
| 2007/0034936 A1 | 2/2007 | Van Schaijk et al. |
| 2007/0123053 A1 | 5/2007 | Kim et al. |
| 2007/0190722 A1 | 8/2007 | Herner |
| 2008/0017894 A1 | 1/2008 | Happ et al. |
| 2008/0070162 A1 | 3/2008 | Ufert |
| 2008/0116441 A1 | 5/2008 | Raghuram et al. |
| 2008/0173858 A1 | 7/2008 | An et al. |
| 2008/0217732 A1 | 9/2008 | Kreupl |
| 2009/0168491 A1 | 7/2009 | Schricker |
| 2009/0201715 A1 | 8/2009 | Kreupl |
| 2009/0257265 A1 | 10/2009 | Chen et al. |
| 2009/0257270 A1 | 10/2009 | Schricker |
| 2009/0262572 A1 | 10/2009 | Krusin-Elbaum et al. |
| 2009/0294832 A1 | 12/2009 | Kakoschke et al. |
| 2010/0006811 A1 | 1/2010 | Xu |
| 2010/0006812 A1 | 1/2010 | Xu |
| 2010/0012914 A1 | 1/2010 | Xu et al. |
| 2010/0032638 A1* | 2/2010 | Xu ................................. 257/2 |
| 2010/0032639 A1 | 2/2010 | Xu |
| 2010/0032640 A1 | 2/2010 | Xu |
| 2010/0032643 A1 | 2/2010 | Xu |
| 2010/0038620 A1 | 2/2010 | Xu et al. |
| 2010/0038623 A1 | 2/2010 | Xu et al. |
| 2010/0081268 A1* | 4/2010 | Schricker et al. ............. 438/600 |
| 2010/0102291 A1 | 4/2010 | Xu |
| 2010/0108976 A1 | 5/2010 | Jayasekara et al. |
| 2010/0108982 A1 | 5/2010 | Ping et al. |
| 2010/0163824 A1 | 7/2010 | Xu et al. |
| 2010/0176366 A1 | 7/2010 | Fu et al. |
| 2010/0193916 A1 | 8/2010 | Xu et al. |
| 2010/0291747 A1 | 11/2010 | Lung et al. |
| 2010/0327254 A1 | 12/2010 | Chen et al. |
| 2011/0037045 A1* | 2/2011 | Fukumizu et al. ................ 257/3 |
| 2011/0095257 A1 | 4/2011 | Xu et al. |
| 2011/0095258 A1 | 4/2011 | Xu et al. |
| 2011/0117679 A1 | 5/2011 | Lee et al. |
| 2011/0204313 A1 | 8/2011 | Chen et al. |
| 2011/0278529 A1 | 11/2011 | Xu |
| 2012/0135603 A1 | 5/2012 | Xu et al. |

FOREIGN PATENT DOCUMENTS

| | | |
|---|---|---|
| EP | 1 916 722 | 4/2008 |
| JP | 2009 218259 | 9/2009 |
| WO | WO 2004/070735 | 8/2004 |
| WO | WO 2006/078505 A2 | 7/2006 |
| WO | WO 2008/078197 | 7/2008 |
| WO | WO 2009/043023 A2 | 4/2009 |
| WO | WO 2009/088889 | 7/2009 |
| WO | WO 2009/110120 | 9/2009 |
| WO | WO 2009/126846 | 10/2009 |
| WO | WO 2009/126891 | 10/2009 |
| WO | WO 2010/017428 | 2/2010 |

OTHER PUBLICATIONS

Li et al., "Electronic Two-Terminal Bistable Graphitic Memories", Nature Materials, vol. 7, 2008, pp. 966-971.

Li et al., U.S. Appl. No. 12/631,913, filed Dec. 7, 2009.

Franz Kreupl et al., U.S. Appl. No. 12/711,810, filed Feb. 24, 2010.

Li et al., U.S. Appl. No. 12/714,359, filed Feb. 26, 2010.

Kreupl et al., "Carbon-Based Resistive Memory", Jun. 26, 2008, IEDM 2008, pp. 1-4.

Gateru et al., "Memory Switching in Ion Bombarded Amorphous Silicon Carbide Thin Film Devices", 2003, Materials Research Society, Mat. Res. Soc. Symp. Proc., vol. 742, pp. 79-83.

Shannon et al., "Memory Switching in Amorphous Silicon-Rich Silicon Carbide", Oct. 28, 1999, Electronics Letters, vol. 35, No. 22, pp. 1976-1978.

Kreupl et al., U.S. Appl. No. 12/760,156, filed Apr. 14, 2010.

Gerstner et al., "Nonvolatile Memory Effects in Nitrogen Doped Tetrahedral Amorphous Carbon Thin Films", Nov. 15, 1998, Journal of Applied Physics, vol. 84, No. 10, pp. 5647-5651.

Takai et al.,"Structure and Electronic Properties of a Nongraphitic Disordered Carbon System and its Heat-Treatment Effects", 2003, Physical Review B 67, 214202, pp. 214202-1-214202-11.

Bhattacharyya, et al., "Resonant Tunnelling and Fast Switching in Amorphous-Carbon Quantum-Well Structures," Dec. 2005, Nanoelectronics Centre, Advanced Technology Institute, pp. 19-22.

Dittmer et al., "Low ambient temperature CVD growth of carbon nanotubes," Appl. Phys. A 84, 2006, p. 1.

Kodama et al., "Properties of Amorphous Carbon Films Synthesized by Atmospheric Pressure Glow Plasma CVD Method," Journal of Photopolymer Science and Technology, vol. 19, No. 5, 2006, pp. 673-678.

Kong et al., "Integration of a gate electrode into carbon nanotube devices for scanning tunneling microscopy," Appl. Phys. Lett. 86, 2005, pp. 112106-1-112106-3.

Bhattacharyya, et al., "Switching behaviour and high frequency response of amorphous carbon double-barrier structures" Aug. 2007, Materials Science and Engineering C, Elsevier Science S.A, CH, vol. 27 No. 5-8, pp. 957-960.

Sin, C-Y et al., "Resist trimming in high-density CF4/02 Plasmas for sub-0.1 [mu]m device fabrication", Jour. Vacuum Sci. & Techno. B (Microelectronics and Nanometer Structures) AIP for American Vacuum Soc. USA, vol. 20, No. 5, pp. 1974-1981, 2002.

Eyoum, M-A et al., "Ashing Technique for Nano-Gap Fabrication of Electrostatic Transducers", Materials Research Society Symposium Proceedings; [Materials Research Society Symposium Proceedings], Materials Research Society, USA, vol. EXS-02, pp. 145-147, 2003.

Communication pursuant to Rules 161(1) and 162(EPC) in counterpart European Application No. 11702106.3 dated Sep. 18, 2012.

* cited by examiner

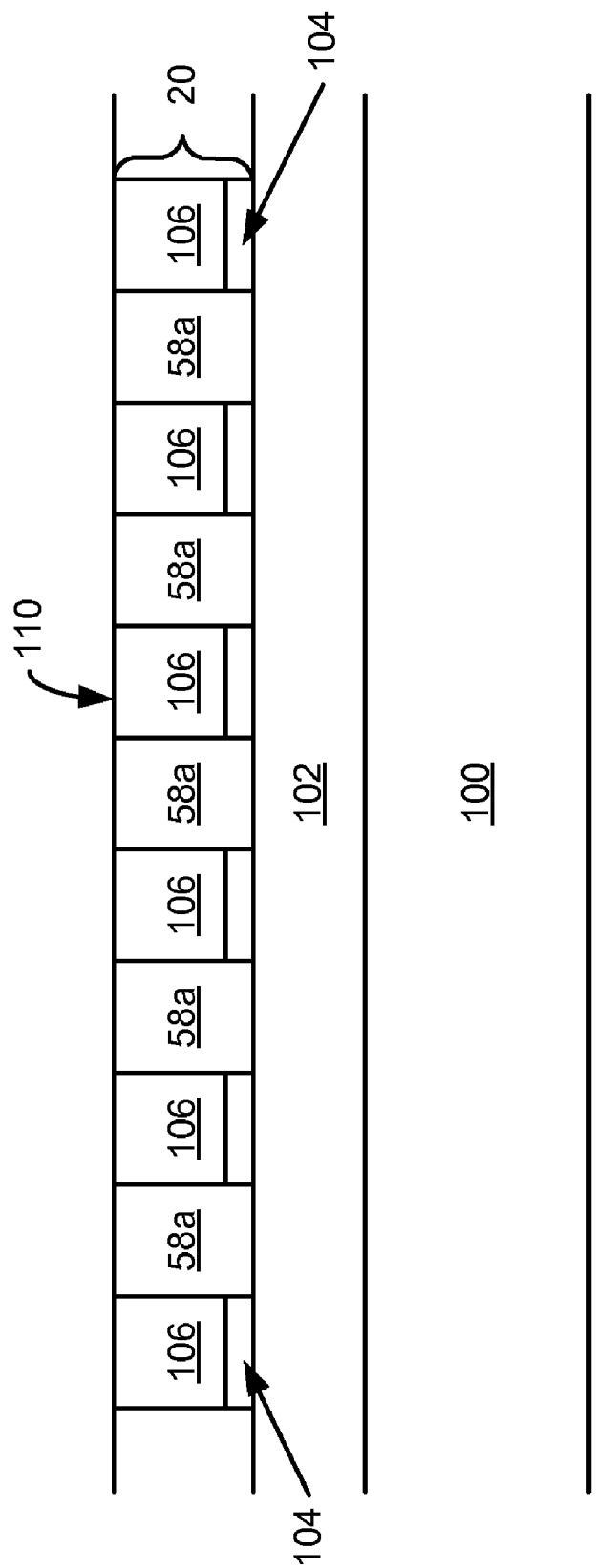

US 8,389,375 B2

MEMORY CELL FORMED USING A RECESS AND METHODS FOR FORMING THE SAME

TECHNICAL FIELD

This invention relates to non-volatile memories, and more particularly to a memory cell formed using a recess and methods of forming the same.

BACKGROUND

Non-volatile memories formed from reversible resistance-switching elements are known. For example, U.S. patent application Ser. No. 11/968,154, filed Dec. 31, 2007, titled "Memory Cell That Employs A Selectively Fabricated Carbon Nano-Tube Reversible Resistance Switching Element And Methods Of Forming The Same" (the "'154 Application"), which is hereby incorporated by reference herein in its entirety for all purposes, describes a rewriteable non-volatile memory cell that includes a diode coupled in series with a carbon-based reversible resistivity switching material.

However, fabricating memory devices from carbon-based switching materials is technically challenging, and improved methods of forming memory devices that employ carbon-based switching materials are desirable.

SUMMARY

In a first aspect of the invention, a method of forming a memory cell is provided, the method including: (1) forming a pillar above a substrate, the pillar comprising a steering element and a metal hardmask layer; (2) selectively removing the metal hardmask layer to create a void; and (3) forming a carbon-based switching material within the void.

In a second aspect of the invention, a method of forming a memory cell is provided, the method including: (1) forming a first conductor above a substrate; (2) forming a pillar above first conductor, the pillar comprising a steering element and a metal hardmask layer; (3) surrounding the pillar with a first dielectric material; (4) selectively removing the metal hardmask layer to create a void in the first dielectric material; (5) forming at least one sidewall liner within the void, the sidewall liner comprising a second dielectric material; (6) forming a carbon-based switching material in the void; (7) planarizing the substrate to expose both the first dielectric material and the carbon-based switching material; and (8) forming a second conductor above the exposed first dielectric material and carbon-based switching material. Numerous other aspects are provided.

Other features and aspects of this invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which:

FIGS. 3A-3J illustrate cross-sectional views of a portion of a substrate during an exemplary fabrication of a single memory level in accordance with this invention.

DETAILED DESCRIPTION

Figure 1:
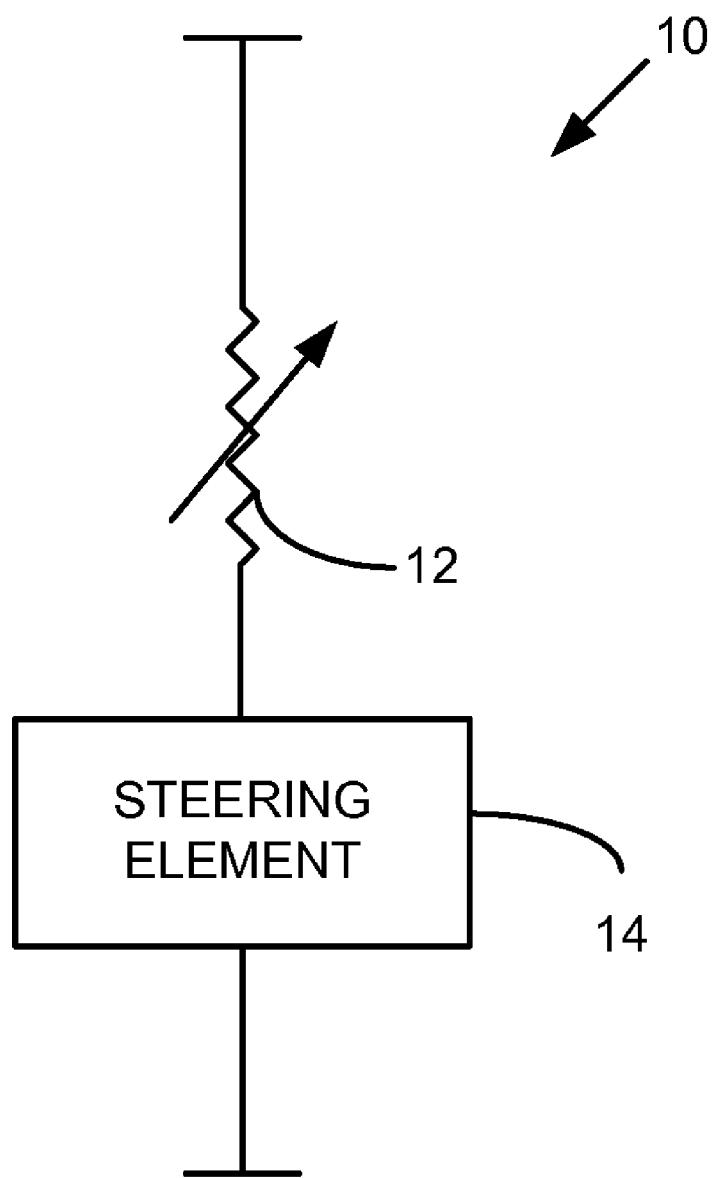
FIG. 1 is a diagram of an exemplary memory cell in accordance with this invention.

Some carbon-based materials have been shown to exhibit reversible resistivity-switching properties that may be suitable for use in non-volatile memories. As used herein, carbon-based read-writeable or "switching" materials generally may include one or more of amorphous carbon containing nanocrystalline graphene (referred to herein as "graphitic carbon"), graphene, graphite, carbon nano-tubes, amorphous diamond-like carbon ("DLC"), silicon carbide, boron carbide and other crystalline forms of carbon, and may also include secondary materials.

Carbon-based switching materials have demonstrated memory switching properties on lab-scale devices with a 100× separation between ON and OFF states and mid-to-high range resistance changes. Such a separation between ON and OFF states renders carbon-based switching materials viable candidates for memory cells in which the carbon-based switching material is coupled in series with vertical diodes, thin film transistors or other steering elements.

For example, a metal-insulator-metal ("MIM") stack formed from a carbon-based switching material sandwiched between two metal or otherwise conducting layers may serve as a resistance-switching element for a memory cell. For example, a carbon nanotube ("CNT") MIM stack may be integrated in series with a diode or transistor to create a read-writable memory device as described, for example, in the '154 Application.

Attempts to integrate the carbon-based switching material using traditional semiconductor processing techniques, however, have proven technically challenging. Deposited or grown CNT material typically has a rough surface topography, with pronounced thickness variations, such as numerous peaks and valleys. These thickness variations make CNT materials difficult to etch without excessive etching of the underlying substrate, increasing fabrication costs and complexity associated with their use in integrated circuits. Blanket CNT films also may cause overlay/alignment difficulties between printed layers as the CNT films may be opaque as well as rough. Other carbon-based switching materials suffer from similar issues.

Carbon based switching materials are also susceptible to being damaged during conventional fabrication processes. For example, exposed carbon-based switching materials sometimes suffer physical damage from the processes and chemicals commonly used to etch features in memory cells. Exposed carbon-based switching materials may also suffer damage from certain deposition processes, such as physical vapor deposition ("PVD"), that are used to form additional layers in a memory cell. Such films also may suffer from adhesion/peeling issues.

In an exemplary embodiment in accordance with this invention, a carbon-based switching material is formed by a damascene integration method that does not require etching of the carbon-based switching material. For example, a pillar of semiconductor material may be formed using a hard mask, and the pillar may be surrounded by dielectric material. The hard mask may be selectively removed from the pillar to leave a void or recess in the dielectric material. The void or recess may serve as a damascene opening into which carbon-based switching material (and in some embodiments a sidewall liner or spacer) may be formed. The carbon-based switching material may be used as a part of a resistance-switching element, such as a metal-insulator-metal stack, in series with a steering element formed from the semiconductor material of the pillar (e.g., a vertical diode).

Notably, in this exemplary embodiment, the carbon-based switching material is not subjected to an etch step during fabrication. Further, because the carbon-based switching material is formed within an opening (void/recess) surrounded by dielectric, peeling/adhesion issues are reduced and/or eliminated. Likewise, blanket layers are not employed. As such, the carbon-based switching material is formed only where needed, requires no etching and does not affect alignment/overlay. Carbon-based switching films may be formed of sufficient thickness to resist electrode penetration/shorting, with a thickness defined by the height of the void formed in the dielectric that surrounds the pillar. Further, the sidewall liner may be used to narrow the cross-sectional area of the carbon-based switching film, allowing the effective resistance of the carbon-based switching material within the void to be more compatible with the steering element that controls current flow through the carbon-based switching material.

Exemplary Inventive Memory Cell

FIG. 1 is a schematic illustration of an exemplary memory cell 10 in accordance with this invention. Memory cell 10 includes a reversible resistance-switching element 12 coupled to a steering element 14. Reversible resistance-switching element 12 includes a reversible resistivity switching material (not separately shown) having a resistivity that may be reversibly switched between two or more states.

For example, reversible resistivity switching material of element 12 may be in an initial, low-resistivity state upon fabrication. Upon application of a first voltage and/or current, the material is switchable to a high-resistivity state. Application of a second voltage and/or current may return reversible resistivity switching material to a low-resistivity state. Alternatively, reversible resistance-switching element 12 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1," although more than two data/resistance states may be used.

Numerous reversible resistivity switching materials and operation of memory cells employing reversible resistance-switching elements are described, for example, in U.S. patent application Ser. No. 11/125,939, filed May 9, 2005 and titled "Rewriteable Memory Cell Comprising A Diode And A Resistance Switching Material" (the "'939 Application"), which is hereby incorporated by reference herein in its entirety for all purposes.

Steering element 14 may include a thin film transistor, a diode, a metal-insulator-metal tunneling current device, or another similar steering element that exhibits non-ohmic conduction by selectively limiting the voltage across and/or the current flow through reversible resistance-switching element 12. In this manner, memory cell 10 may be used as part of a two or three dimensional memory array and data may be written to and/or read from memory cell 10 without affecting the state of other memory cells in the array.

Exemplary embodiments of memory cell 10, reversible resistance-switching element 12 and steering element 14 are described below with reference to FIGS. 2A-2D.

Exemplary Embodiments of Memory Cells and Memory Arrays

Figure 2A:
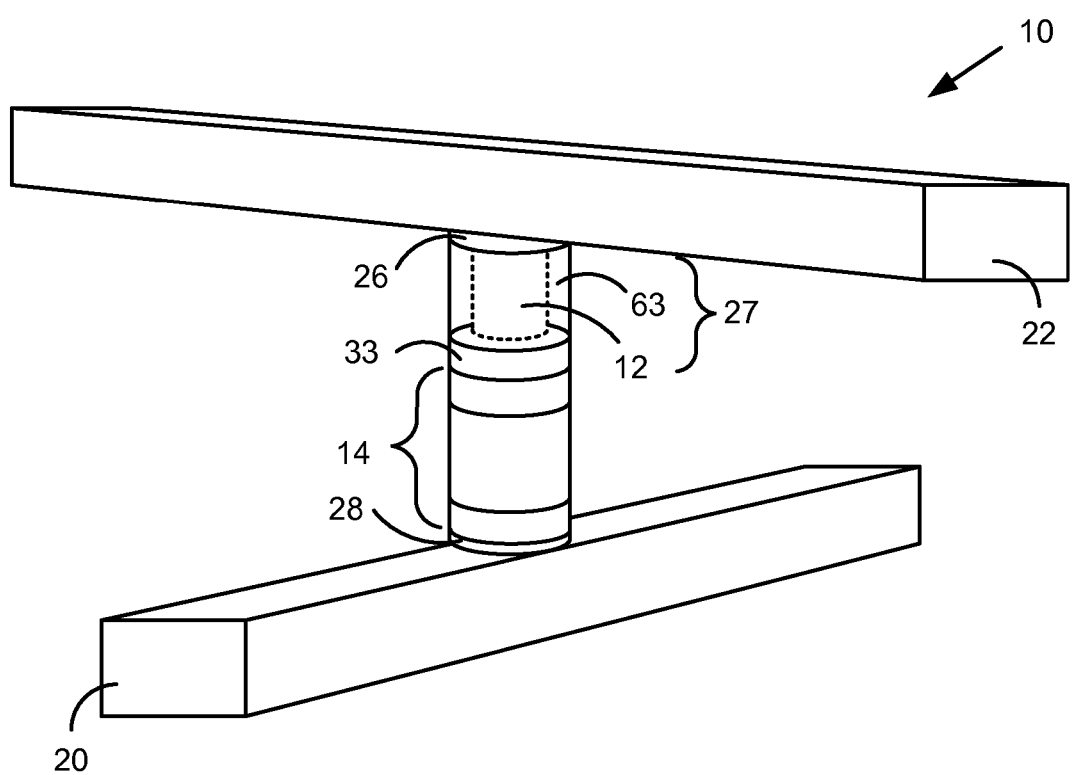
FIG. 2A is a simplified perspective view of an exemplary memory cell in accordance with this invention.

FIG. 2A is a simplified perspective view of an exemplary embodiment of a memory cell 10 in accordance with this invention in which steering element 14 is a diode. Memory cell 10 includes a carbon-based reversible resistivity switching material 12 ("C-based switching material 12") coupled in series with a diode 14 between a first conductor 20 and a second conductor 22. In some embodiments, a barrier layer 33 may be formed between C-based switching material 12 and diode 14, and a barrier layer 26 may be formed between C-based switching material 12 and second conductor 22 (forming an MIM stack 27 that may serve as a reversible resistance-switching element). An additional barrier layer 28 may be formed between diode 14 and first conductor 20. Barrier layers 33, 26 and 28 may include titanium nitride, tantalum nitride, tungsten, tungsten nitride, molybdenum, or another similar barrier layer. Barrier layer 26 may be separate from or part of second conductor 22 and barrier layer 28 may be separate from or part of first conductor 20. As shown in FIG. 2A, and described in more detail below, in some embodiments, C-based switching material 12 is surrounded at least in part by sidewall liner 63.

As will be described in more detail below, in some embodiments, a tungsten or similar hard mask is used during formation of memory cell 10. Use of metal hard masks is described, for example, in U.S. patent application Ser. No. 11/444,936, filed May 13, 2006 and titled "Conductive Hard Mask To Protect Patterned Features During Trench Etch" (the "'936 Application") which is hereby incorporated by reference herein in its entirety for all purposes.

Diode 14 may include any suitable diode such as a vertical polycrystalline p-n or p-i-n diode, whether upward pointing with an n-region above a p-region of the diode or downward pointing with a p-region above an n-region of the diode. Exemplary embodiments of diode 14 are described below with reference to FIGS. 3A-J.

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with first conductor 20 and/or second conductor 22 to improve device performance and/or aid in device fabrication.

Figure 2B:
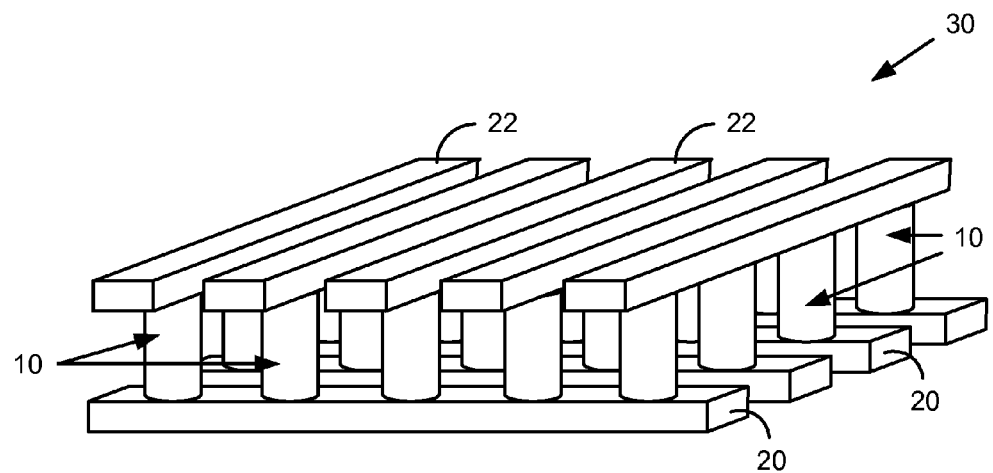
FIG. 2B is a simplified perspective view of a portion of a first exemplary memory level formed from a plurality of the memory cells of FIG. 2A.

FIG. 2B is a simplified perspective view of a portion of a first memory level 30 formed from a plurality of memory cells 10, such as memory cells 10 of FIG. 2A. For simplicity, C-based switching material 12, diode 14, and barrier layers 33, 26 and 28 are not separately shown. Memory array 30 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
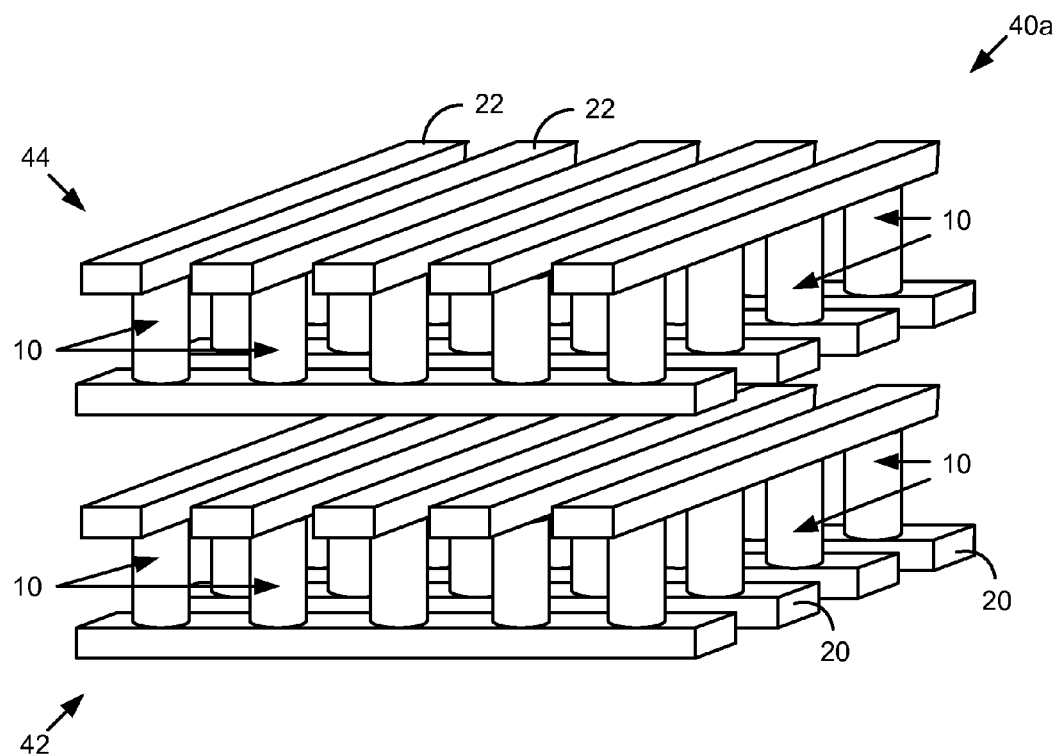
FIG. 2C is a simplified perspective view of a portion of a first exemplary three-dimensional memory array in accordance with this invention.

FIG. 2C is a simplified perspective view of a portion of a monolithic three dimensional memory array 40a that includes a first memory level 42 positioned below a second memory level 44. Memory levels 42 and 44 each include a plurality of memory cells 10 in a cross-point array. Persons of ordinary skill in the art will understand that additional layers (e.g., an interlevel dielectric) may be present between first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
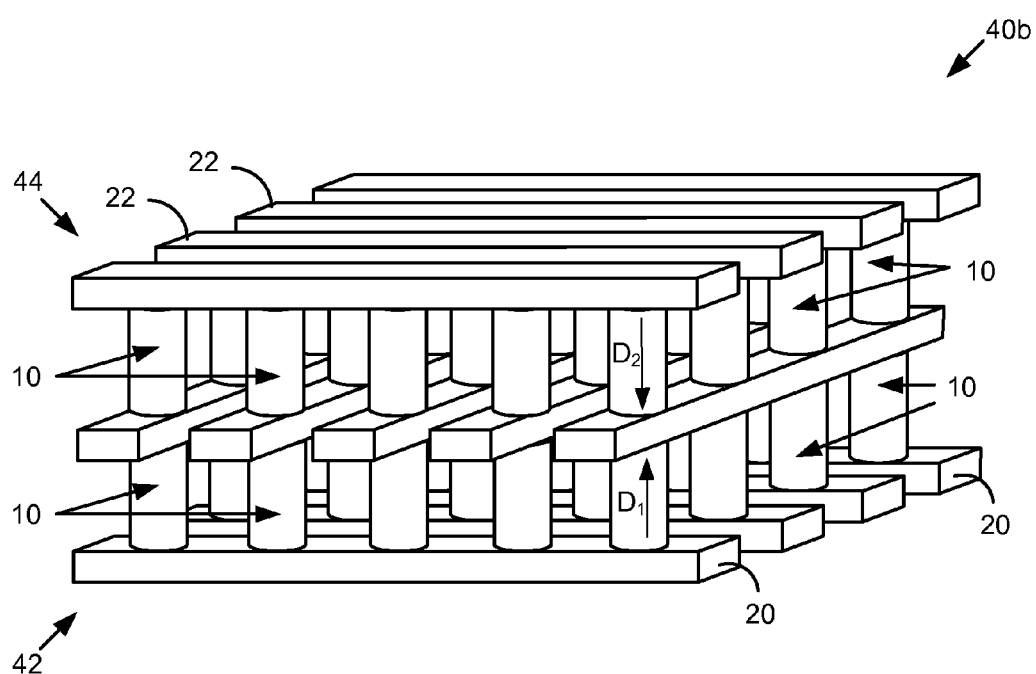
FIG. 2D is a simplified perspective view of a portion of a second exemplary three-dimensional memory array in accordance with this invention.

In some embodiments, the memory levels may be formed as described in U.S. Pat. No. 6,952,030, titled "High-Density Three-Dimensional Memory Cell," which is hereby incorporated by reference herein in its entirety for all purposes. For instance, the second conductors of a first memory level may be used as the first conductors of a second memory level that is positioned above the first memory level as shown in FIG. 2D. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 Application"), which is hereby incorporated by reference herein in its entirety for all purposes.

For example, as shown in FIG. 2D, the diodes of first memory level 42 may be upward pointing diodes as indicated by arrow D1 (e.g., with p regions at the bottom of the diodes), whereas the diodes of second memory level 44 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Exemplary Fabrication Processes for Memory Cells

Referring now to FIGS. 3A-3J, a first exemplary method of forming a memory level in accordance with this invention is described. In particular, FIGS. 3A-3J illustrate an exemplary method of forming a memory level including memory cells 10 of FIG. 2A. As will be described below, the first memory level includes a plurality of memory cells that each include a steering element and a C-based switching material coupled to the steering element. Additional memory levels may be fabricated above the first memory level (as described previously with reference to FIGS. 2C-2D).

With reference to FIG. 3A, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown).

Isolation layer 102 is formed above substrate 100. In some embodiments, isolation layer 102 may be a layer of silicon dioxide, silicon nitride, silicon oxynitride or any other suitable insulating layer.

Following formation of isolation layer 102, an adhesion layer 104 is formed over isolation layer 102 (e.g., by PVD or another method). For example, adhesion layer 104 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition ("CVD"), PVD, etc.). In at least one embodiment, conductive layer 106 may comprise about 200 to about 2500 angstroms of tungsten. Other conductive layer materials and/or thicknesses may be used.

Following formation of conductive layer 106, adhesion layer 104 and conductive layer 106 are patterned and etched. For example, adhesion layer 104 and conductive layer 106 may be patterned and etched using conventional lithography techniques, with a soft or hard mask, and wet or dry etch processing. In at least one embodiment, adhesion layer 104 and conductive layer 106 are patterned and etched to form substantially parallel, substantially co-planar first conductors 20. Exemplary widths for first conductors 20 and/or spacings between first conductors 20 range from about 200 to about 2500 angstroms, although other conductor widths and/or spacings may be used.

After first conductors 20 have been formed, a dielectric layer 58a is formed over substrate 100 to fill the voids between first conductors 20. For example, approximately 3000-7000 angstroms of silicon dioxide may be deposited on substrate 100 and planarized using chemical mechanical polishing or an etchback process to form a planar surface 110. Planar surface 110 includes exposed top surfaces of first conductors 20 separated by dielectric material (as shown). Other dielectric materials such as silicon nitride, silicon oxynitride, low k dielectrics, etc., and/or other dielectric layer thicknesses may be used. Exemplary low k dielectrics include carbon doped oxides, silicon carbon layers, or the like.

In other embodiments of the invention, first conductors 20 may be formed using a damascene process in which dielectric layer 58a is formed, patterned and etched to create openings or voids for first conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 110. In such an embodiment, adhesion layer 104 will line the bottom and sidewalls of each opening or void.

Figure 3B:
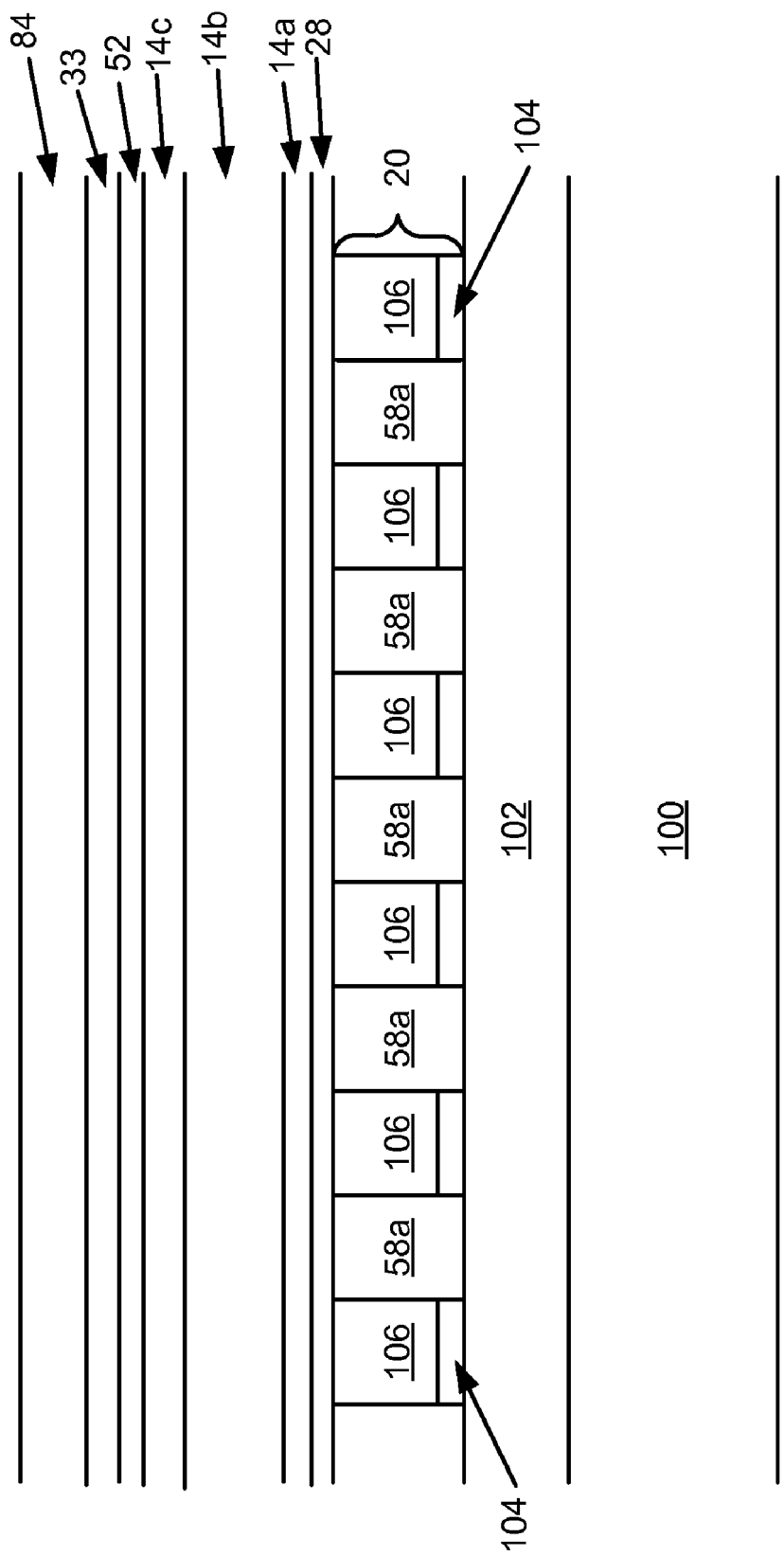

With reference to FIG. 3B, a barrier layer 28 is formed over planarized top surface 110 of substrate 100. Barrier layer 28 may be about 20 to about 500 angstroms, and preferably about 100 angstroms, of titanium nitride or another suitable barrier layer such as tantalum nitride, tungsten, tungsten nitride, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 28, deposition of the semiconductor material used to form the diode of each memory cell begins (e.g., diode 14 in FIGS. 1 and 2A). Each diode may be a vertical upward or downward pointing p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 3B, following formation of barrier layer 28, a heavily doped n+ silicon layer 14a is deposited on barrier layer 28. In some embodiments, n+ silicon layer 14a is in an amorphous state as deposited. In other embodiments, n+ silicon layer 14a is in a polycrystalline state as deposited. CVD or another suitable process may be employed to deposit n+ silicon layer 14a. In at least one embodiment, n+ silicon layer 14a may be formed, for example, from about 100 to about 1000 angstroms, preferably about 100 angstroms, of phosphorus or arsenic doped silicon having a doping concentration of about $10^{21}$ $cm^{-3}$. Other layer thicknesses, doping types and/or doping concentrations may be used. N+ silicon layer 14a may be doped in situ, for example, by flowing a donor gas during deposition. Other doping methods may be used (e.g., implantation).

After deposition of n+ silicon layer 14a, a lightly doped, intrinsic and/or unintentionally doped silicon layer 14b may be formed over n+ silicon layer 14a. In some embodiments, intrinsic silicon layer 14b may be in an amorphous state as deposited. In other embodiments, intrinsic silicon layer 14b may be in a polycrystalline state as deposited. CVD or another suitable deposition method may be employed to deposit intrinsic silicon layer 14b. In at least one embodiment, intrinsic silicon layer 14b may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 14a prior to depositing intrinsic silicon layer 14b to prevent and/or reduce dopant migration from n+ silicon layer 14a into intrinsic silicon layer 14b (as described in U.S. patent application Ser. No. 11/298,331, filed Dec. 9, 2005 and titled "Deposited Semiconductor Structure To Minimize N-Type Dopant Diffusion And Method Of Making," which is hereby incorporated by reference herein in its entirety for all purposes).

Heavily doped, p-type silicon may be either deposited and doped by ion implantation or may be doped in situ during deposition to form a p+ silicon layer 14c. For example, a blanket p+ implant may be employed to implant boron a predetermined depth within intrinsic silicon layer 14b. Exemplary implantable molecular ions include $BF_2$, $BF_3$, B and the like. In some embodiments, an implant dose of about 1–5× $10^{15}$ ions/$cm^2$ may be employed. Other implant species and/or doses may be used. Further, in some embodiments, a diffusion process may be employed. In at least one embodiment, the resultant p+ silicon layer 14c has a thickness of about 100-700 angstroms, although other p+ silicon layer sizes may be used.

Following formation of p+ silicon layer 14c, a silicide-forming metal layer 52 is deposited over p+ silicon layer 14c. Exemplary silicide-forming metals include sputter or otherwise deposited titanium or cobalt. In some embodiments, silicide-forming metal layer 52 has a thickness of about 10 to about 200 angstroms, preferably about 20 to about 50 angstroms and more preferably about 20 angstroms. Other silicide-forming metal layer materials and/or thicknesses may be used. A nitride layer (not shown) may be formed at the top of silicide-forming metal layer 52.

A rapid thermal anneal ("RTA") step may be performed to form silicide regions by reaction of silicide-forming metal layer 52 with p+ region 14c. In some embodiments, the RTA may be performed at about 540° C. for about 1 minute, and causes silicide-forming metal layer 52 and the deposited silicon of diode 14 to interact to form a silicide layer, consuming all or a portion of silicide-forming metal layer 52. Following the RTA step, any residual nitride layer from silicide-forming metal layer 52 may be stripped using a wet chemistry. For example, if silicide-forming metal layer 52 includes a TiN top layer, a wet chemistry (e.g., ammonium, peroxide, water in a 1:1:1 ratio) may be used to strip any residual TiN.

As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., a silicide layer enhances the crystalline structure of silicon diode 14 during annealing). Lower resistivity silicon thereby is provided. Similar results may be achieved for silicon-germanium alloy and/or germanium diodes.

Following the RTA step and the nitride strip step, a barrier layer 33 is formed above silicide-forming metal layer 52. Barrier layer 33 may be about 5 to about 800 angstroms, and preferably about 100 angstroms, of titanium nitride or another suitable barrier layer such as tantalum nitride, tungsten, tungsten nitride, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

Hardmask layer 84 is formed above barrier layer 33. Hardmask layer 84 may include tungsten, tungsten nitride, another metal, silicon dioxide or another similar hardmask material. In some embodiments, hardmask layer 84 may be tungsten and have a thickness between about 500-600 angstroms, more generally between about 400-700 angstroms. Hardmask layer 84 may be formed using any suitable technique, such as plasma enhanced chemical vapor deposition ("PECVD"), PVD, CVD, etc.

Figure 3C:
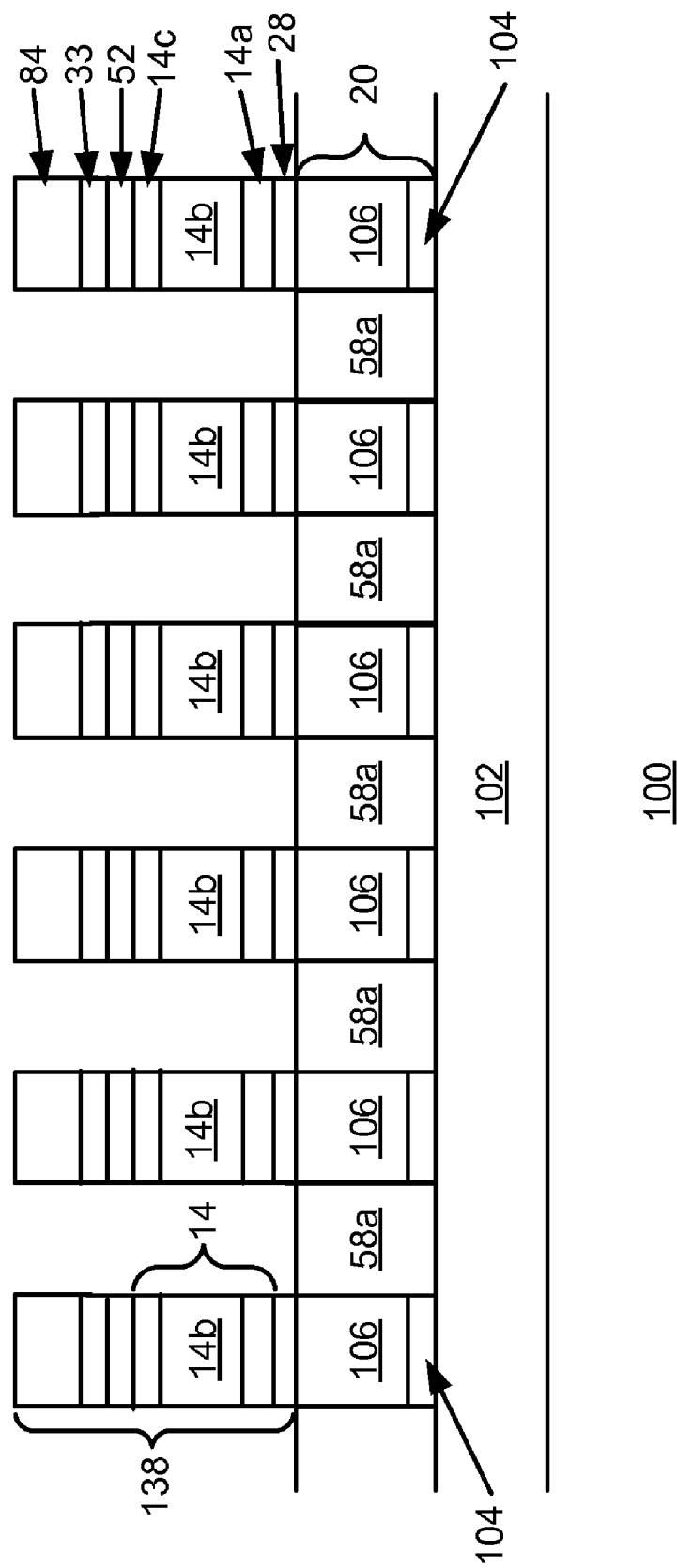
Figure 3D:
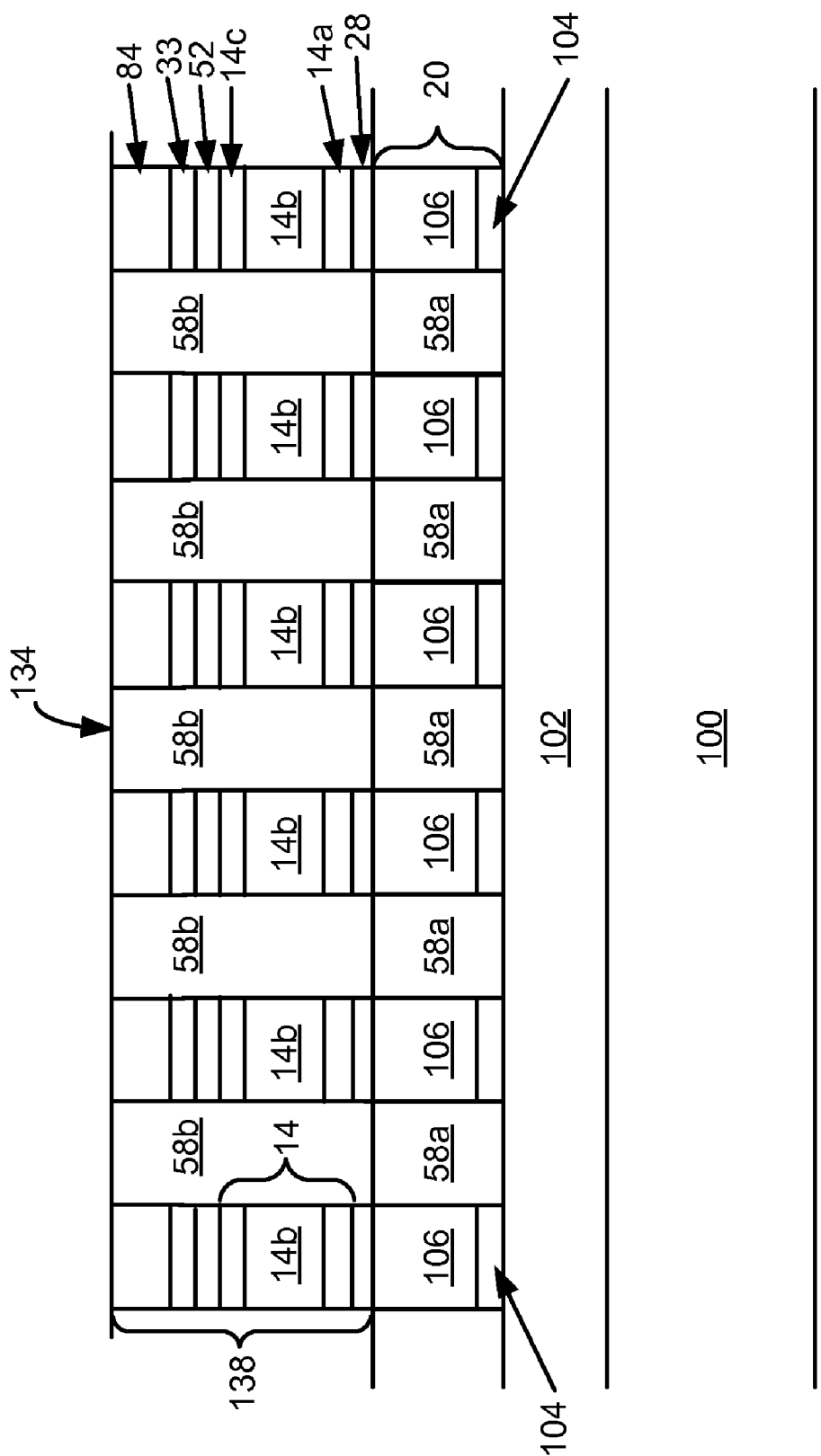

As shown in FIG. 3C, hardmask layer 84, barrier layer 33, silicide-forming metal layer 52, diode layers 14a-14c and barrier layer 28 are patterned and etched to form pillars 138. In some embodiments, pillars 138 may have about the same pitch and about the same width as first conductors 20 below, such that each pillar 138 is formed on top of a first conductor 20. Some misalignment may be tolerated.

In at least one embodiment, photoresist may be deposited and patterned using standard photolithography techniques. Layers 28, 14a-14c, 52, 33, and 84 then may be etched, and the photoresist may be removed. Alternatively, a hard mask of some other material, for example silicon dioxide, may be formed on top of barrier layer 33, with bottom antireflective coating ("BARC") on top, then patterned and etched. Similarly, dielectric antireflective coating ("DARC") may be used as a hard mask.

Pillars 138 may be formed using any suitable masking and etching process. For example, layers 28, 14a-14c, 52, 33, and 84 may be patterned with about 1 to about 1.5 micron, more preferably about 1.2 to about 1.4 micron, of photoresist ("PR") using standard photolithographic techniques. Thinner PR layers may be used with smaller critical dimensions and technology nodes.

Any suitable etch chemistries, and any suitable etch parameters, flow rates, chamber pressures, power levels, process temperatures, and/or etch rates may be used. In some embodiments, hardmask layer 84, barrier layer 33, silicide-forming metal layer 52, diode layers 14a-14c and barrier layer 28 may be patterned using a single etch step. In other embodiments, separate etch steps may be used. The etch proceeds down to dielectric layer 58a.

After etching, pillars 138 may be cleaned using a dilute hydrofluoric/sulfuric acid clean. Such cleaning, whether or not PR asking is performed before etching, may be performed in any suitable cleaning tool, such as a Raider tool, available from Semitool of Kalispell, Mont. Exemplary post-etch cleaning may include using ultra-dilute sulfuric acid (e.g., about 1.5-1.8 wt %) for about 60 seconds and ultra-dilute hydrofluoric ("HF") acid (e.g., about 0.4-0.6 wt %) for 60 seconds. Megasonics may or may not be used.

After pillars 138 have been cleaned, a dielectric layer 58b may be deposited over pillars 138 to fill the voids between pillars 138. For example, approximately 200-7000 angstroms of silicon dioxide may be deposited and planarized using chemical mechanical polishing or an etchback process to remove excess dielectric material 58b and form a planar surface 134, resulting in the structure illustrated in FIG. 3D. Planar surface 134 includes exposed hardmask layer regions 84 separated by dielectric material 58b (as shown). Other dielectric materials such as silicon nitride, silicon oxynitride, low k dielectrics, etc., and/or other dielectric layer thicknesses may be used.

Figure 3E:
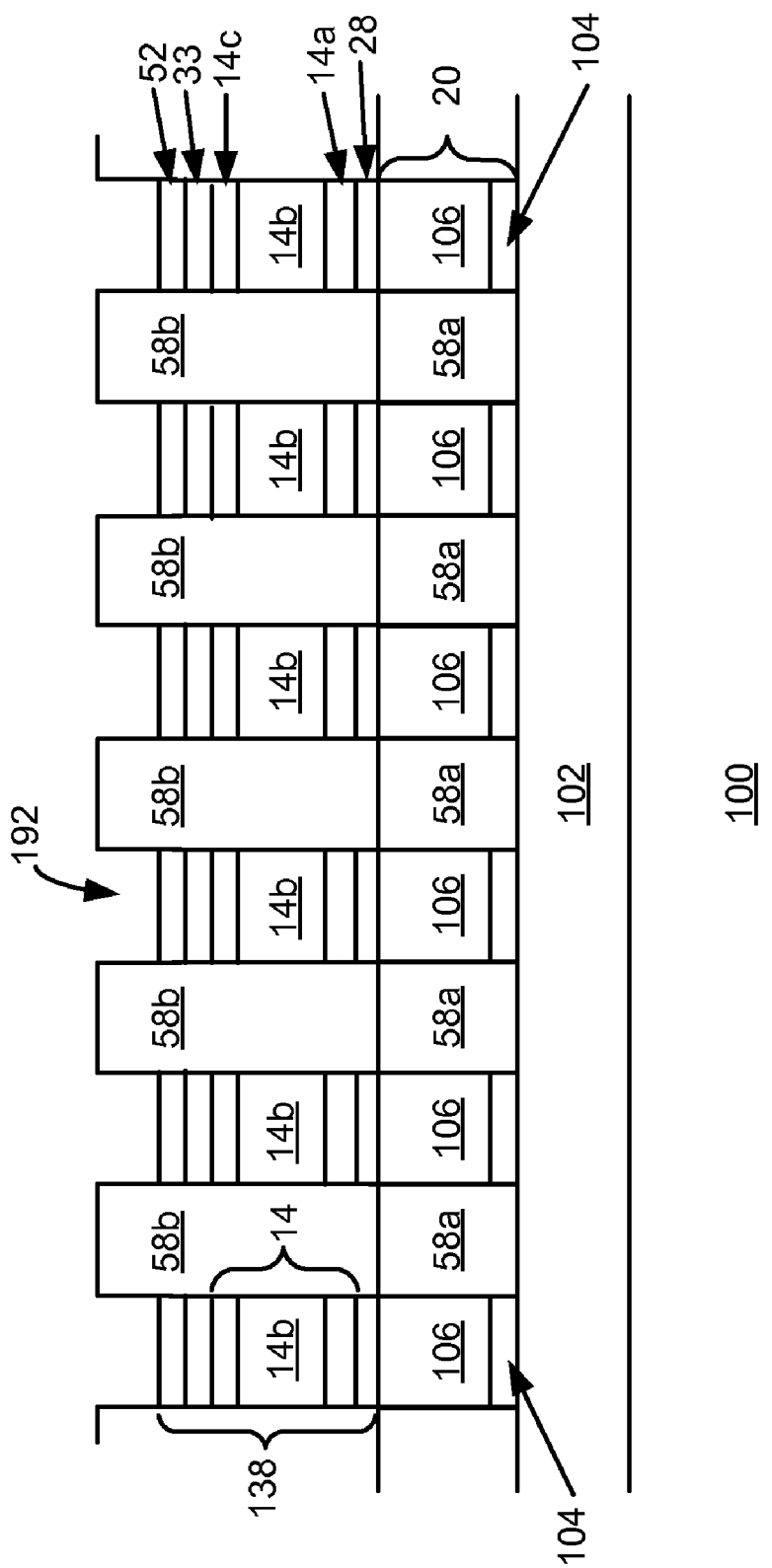

Referring to FIG. 3E, hardmask layer 84 is selectively etched and removed. For example, when hardmask layer 84 comprises tungsten, the tungsten hardmask may be selectively removed by using a mixture of hydrofluoric acid and ozone. A solution comprising between about 0.025 Wt % and 0.15 Wt %, more generally between about 0.01 Wt % and about 2.0 Wt % of hydrofluoric acid, and between about 300 ppm and 500 ppm, more generally between about 10 ppm and about 500 ppm, of ozone, may be used.

In one exemplary embodiment, a solution of about 0.05 Wt % hydrofluoric acid mixed with 100-500 ppm gas phase ozone is prepared. The solution may be delivered using any suitable delivery mechanism such as a Semitool Raider platform using a spray acid chamber, for example. The etch process may be performed at temperatures between about 21° C.-25° C., and more generally between about 18° C.-35° C. For every 500 angstroms of tungsten to be removed, the process may be run for between about 0.1-6 minutes, preferably about 3-4 minutes. Other oxidizers may be used in place of ozone, such as $H_2O_2$ or the like. As shown in FIG. 3E, removal of tungsten hardmask 84 creates voids or recesses 192 above pillars 138.

Figure 3F:
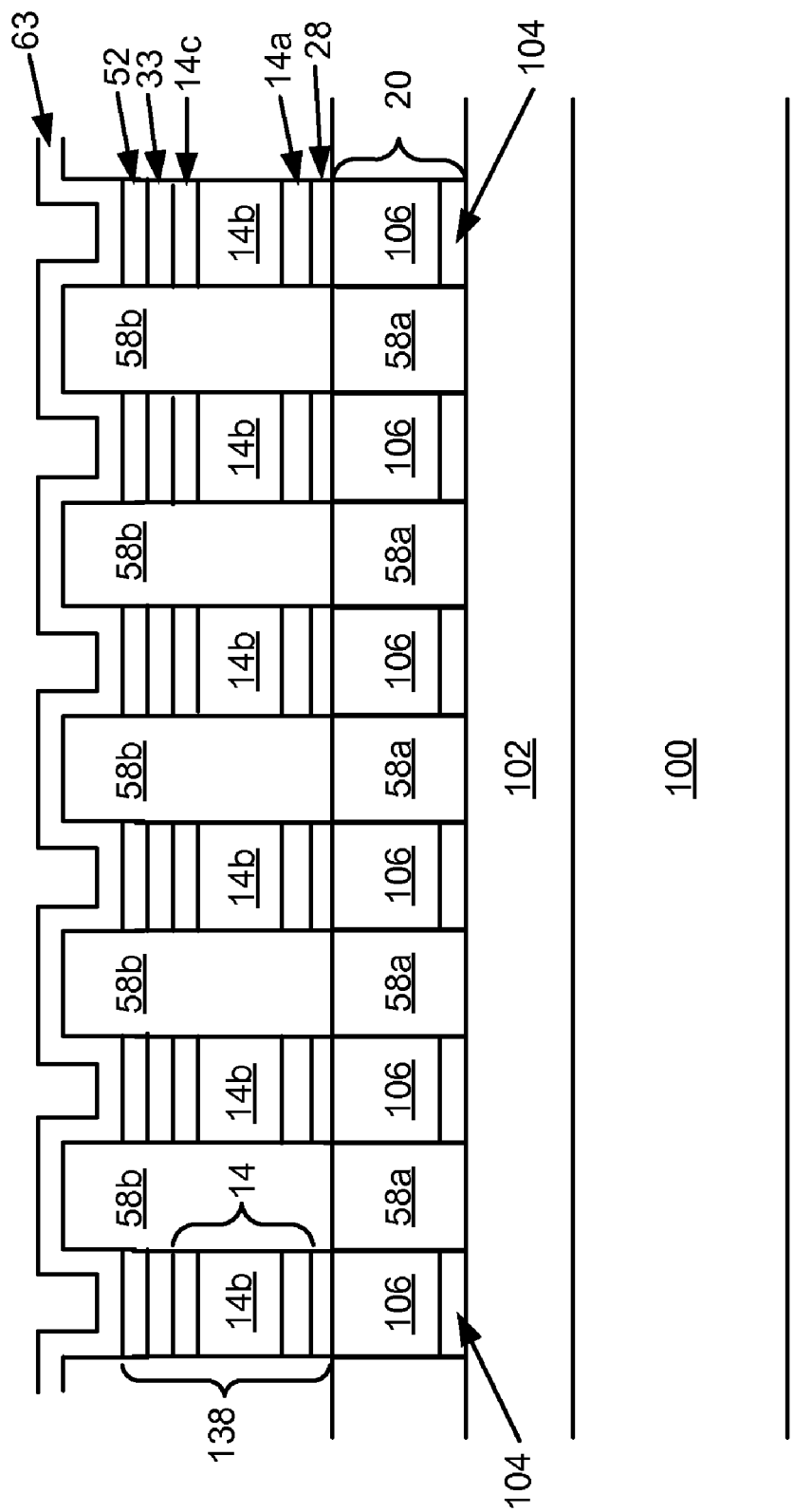

In one exemplary embodiment, a conformal dielectric liner 63 is formed above pillars 138 and in voids 192, as shown in FIG. 3F. For example, between about 25 angstroms and about 75 angstroms, more generally between about 10 and about 100 angstroms, of silicon dioxide may be deposited over substrate 100 using any suitable conformal technique such as atomic layer deposition ("ALD"), PECVD, etc. Other dielectric materials such as silicon nitride, silicon oxynitride, low k dielectrics, etc., and/or other dielectric layer thicknesses may be used.

In some embodiments, tungsten residue may remain on the sidewalls of voids 192 following removal of tungsten hardmask layer 84. Coating the sidewalls with a dielectric such as silicon nitride may encapsulate any conductive residue and prevent the C-based switching material deposited within the voids from being shorted.

Figure 3G:
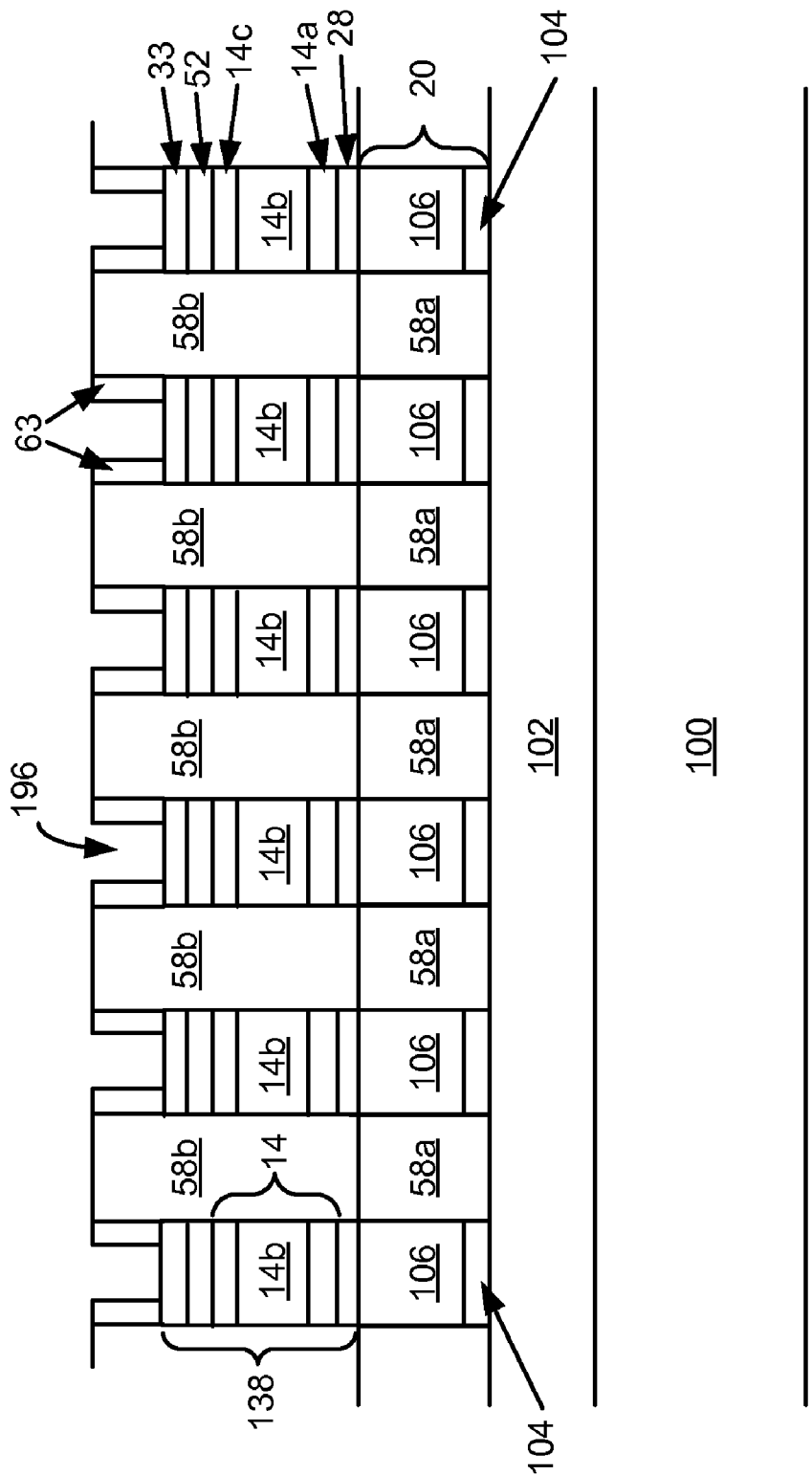

With reference to FIG. 3G, sidewall spacers 63 are formed by selectively etching dielectric liner 63 to remove dielectric material from the bottoms of voids 192 and from the top surfaces of dielectric material 58b. For example, a standard spacer etch process such as $CH_3F/O_2$ silicon nitride spacer etch commonly used for CMOS fabrication may be used. In other embodiments, other etching techniques may used.

With reference to FIG. 3G, formation of sidewall spacers 63 creates voids 196 above pillars 138. Due to the presence of sidewall spacers 63, each void 196 has a width that is smaller than the width of diodes 14. In some embodiments, each void 196 may have a width of about 5-40 nanometers, although other widths may be used.

Figure 3H:
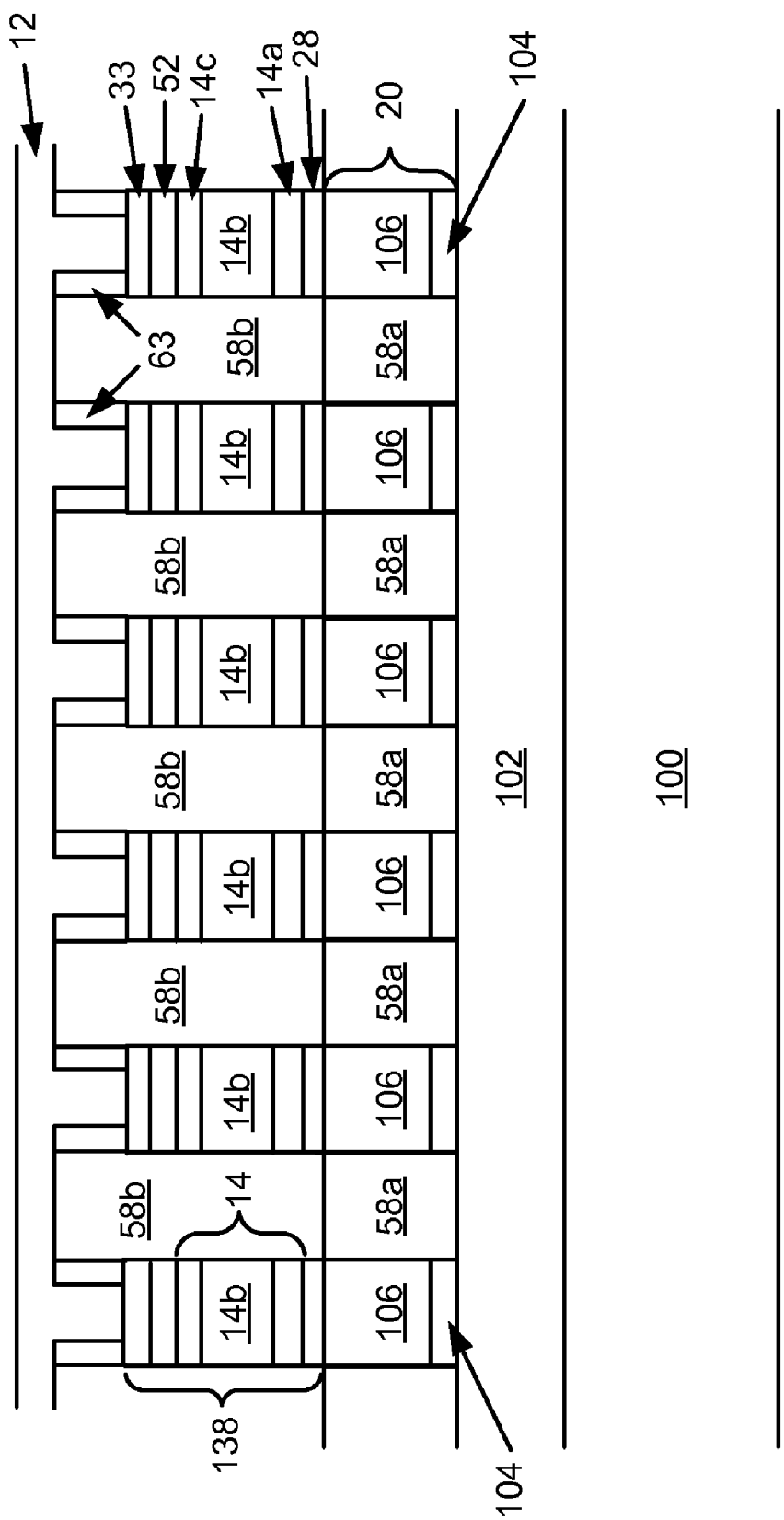

With reference to FIG. 3H, following sidewall spacer formation, a layer of C-based switching material 12 is formed within voids 196 and above dielectric material 58b. C-based switching material 12 may include any desired carbon-based reversible resistivity switching material such as graphene, graphite, amorphous carbon, carbon nanotube material, amorphous diamond-like carbon, silicon carbide, boron carbide, other forms of crystalline carbon, etc.

In some embodiments, the C-based switching material may comprise amorphous carbon formed using PECVD. Other materials and/or methods may be used, including, PVD, CVD, arc discharge techniques, and laser ablation. For each C-based switching material, a ratio of $sp^2$ (double carbon-carbon bonds) to $sp^3$ (single carbon-carbon bonds) bonds may be determined via, e.g., Raman spectroscopy, by evaluating the D and G bands. The range of usable materials may be identified by a ratio such as $M_yN_z$, where M is the $sp^3$ material and N is the $sp^2$ material, and y and z are any fractional value from zero to one and y+z=1. Prior to planarization, C-based switching material layer 12 may have a thickness between about 150-415 angstroms, and more generally between about 50-700 angstroms. Other thicknesses may be used.

Figure 3I:
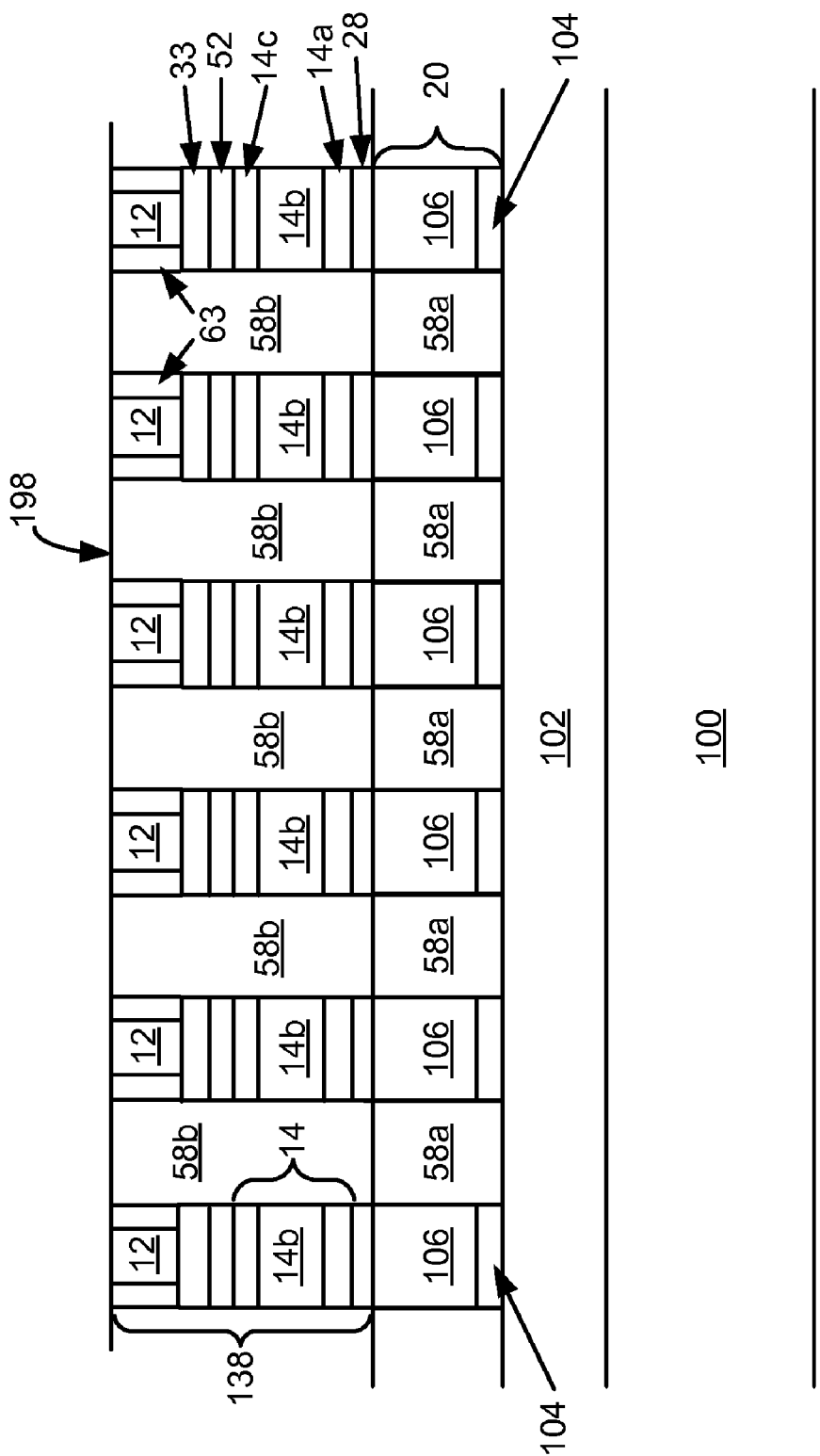

After the C-based switching material layer 12 has been formed, C-based switching layer 12 is planarized using chemical mechanical polishing or an etchback process to remove excess C-based switching material and to form a planar surface 198 (FIG. 3I). In this manner, a region of C-based switching material 12 is formed above each diode 14. Exemplary thicknesses for the resultant C-based switching material regions range from about 50-700 angstroms, and in some embodiments about 400-500 angstroms, although other thicknesses may be used. The reduced cross-sectional area for the C-based switching material increases an effective resistance of the reversible resistance-switching element formed therefrom, and thereby decreases initial current flow through the reversible resistance-switching element (making the switching element more compatible with diode 14).

In some embodiments in accordance with this invention, following formation of C-based material 12, an anneal step may be performed prior to depositing additional material. In particular, the anneal may be performed in a vacuum or the presence of one or more forming gases, at a temperature in the range from about 350° C. to about 900° C., for about 30 to about 180 minutes. The anneal preferably is performed in about an 80% ($N_2$):20% ($H_2$) mixture of forming gases, at about 625° C. for about one hour.

Suitable forming gases may include one or more of $N_2$, Ar, and $H_2$, whereas preferred forming gases may include a mixture having above about 75% $N_2$ or Ar and below about 25% $H_2$. Alternatively, a vacuum may be used. Suitable temperatures may range from about 350° C. to about 900° C., whereas preferred temperatures may range from about 585° C. to about 675° C. Suitable durations may range from about 0.5 hour to about 3 hours, whereas preferred durations may range from about 1 hour to about 1.5 hours. Suitable pressures may range from about 1 mT to about 760T, whereas preferred pressures may range from about 300 mT to about 600 mT.

A queue time of preferably about 2 hours between the anneal and the deposition of additional layers preferably accompanies the use of the anneal. A ramp up duration may range from about 0.2 hours to about 1.2 hours and preferably is between about 0.5 hours and 0.8 hours. Similarly, a ramp down duration also may range from about 0.2 hours to about 1.2 hours and preferably is between about 0.5 hours and 0.8 hours.

Although not wanting to be bound by any particular theory, it is believed that carbon-based switching material may absorb water from the air over time. Likewise, it is believed that the moisture may increase the likelihood of de-lamination of the carbon-based switching material. In some cases, it also might be acceptable to have a queue time of 2 hours from the time of deposition of carbon-based switching material to deposition of additional layers, skipping the anneal altogether.

Incorporation of such a post-carbon-formation-anneal preferably takes into account other layers of the memory cell, because these other memory cell layers will also be subject to the anneal. For example, the anneal may be omitted or its parameters may be adjusted where the aforementioned preferred anneal parameters would damage the other memory cell layers. The anneal parameters may be adjusted within ranges that result in the removal of moisture without damaging the layers of the annealed memory cell.

For instance, the temperature may be adjusted to stay within an overall thermal budget of a memory cell being formed. Likewise, any suitable forming gases, temperatures and/or durations may be used that are appropriate for a particular memory cell. In general, such an anneal may be used with any carbon-based switching material, such as CNT material, graphite, graphene, amorphous carbon, amorphous DLC, silicon carbide, boron carbide and other crystalline forms of carbon.

Figure 3J:
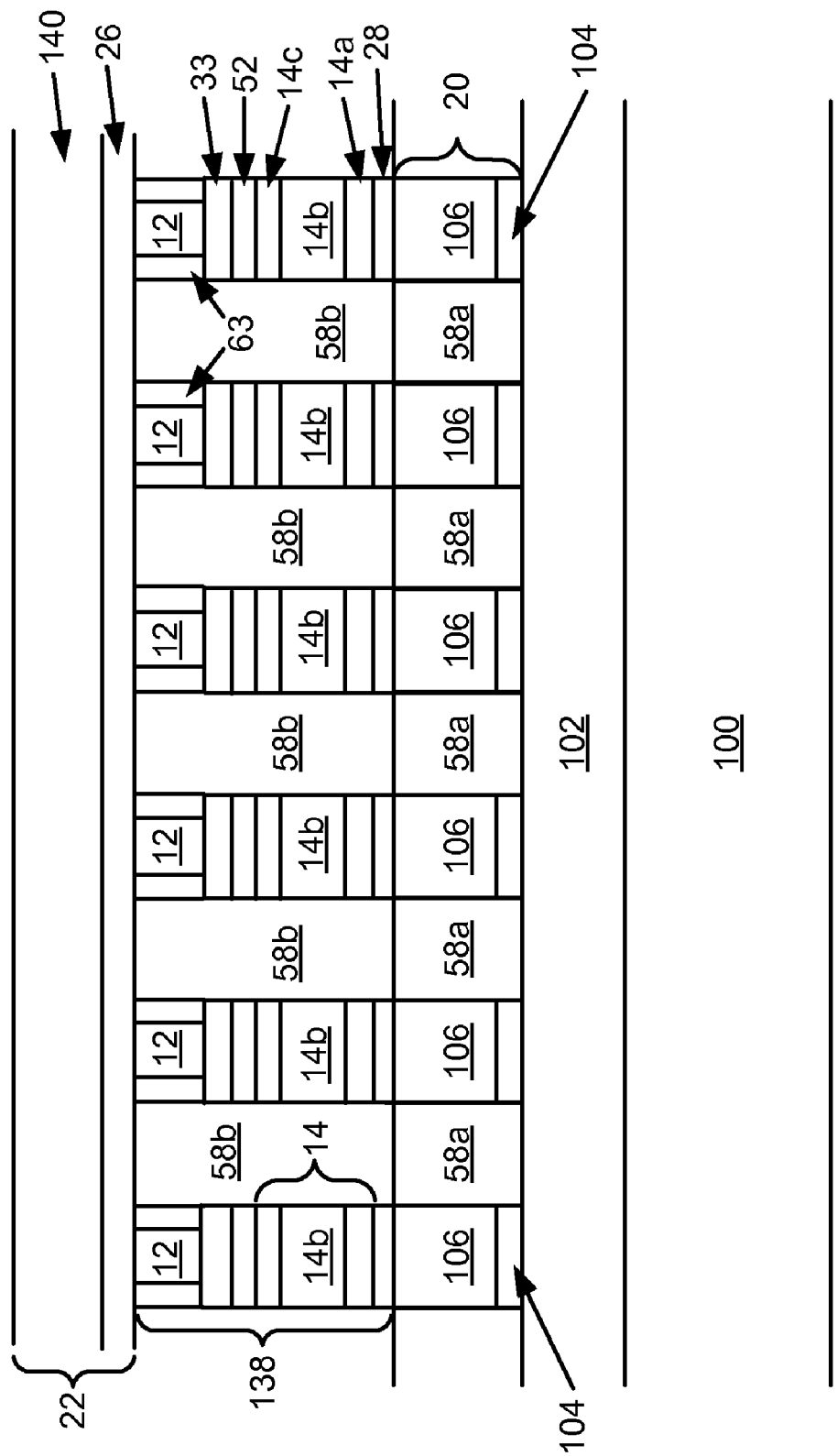

With reference to FIG. 3J, second conductors 22 may be formed above pillars 138 in a manner similar to the formation of first conductors 20. For example, in some embodiments, one or more barrier layers and/or adhesion layers 26 may be deposited over pillars 138 prior to deposition of a conductive layer 140 used to form second conductors 22.

Conductive layer 140 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layers and/or adhesion layers 26 may include titanium nitride or another suitable layer such as tantalum nitride, tungsten, tungsten nitride, molybdenum, combinations of one or more layers, or any other suitable material(s). The deposited conductive layer 140 and barrier and/or adhesion layer 26 may be patterned and etched to form second conductors 22. In at least one embodiment, second conductors 22 are substantially parallel, substantially coplanar conductors that extend in a different direction than first conductors 20.

In other embodiments of the invention, second conductors 22 may be formed using a damascene process in which a dielectric layer is formed, patterned and etched to create openings or voids for second conductors 22. The openings or voids may be filled with adhesion layer 26 and conductive layer 140 (and/or a conductive seed, conductive fill and/or barrier layer if needed). Adhesion layer 26 and conductive layer 140 then may be planarized to form a planar surface.

Following formation of second conductors 22, the resultant structure may be annealed to crystallize the deposited semiconductor material of diodes 14 (and/or to form silicide regions by reaction of silicide-forming metal layer 52 with p+ region 14c). The lattice spacing of titanium silicide and cobalt silicide are close to that of silicon, and it appears that silicide layers may serve as "crystallization templates" or "seeds" for adjacent deposited silicon as the deposited silicon crystallizes (e.g., a silicide layer enhances the crystalline structure of silicon diode 14 during annealing at temperatures of about 600-800° C.). Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600 to 800° C., and more preferably between about 650 and 750° C. Other annealing times, temperatures and/or environments may be used.

Persons of ordinary skill in the art will understand that alternative memory cells in accordance with this invention may be fabricated by other similar techniques.

The foregoing description discloses only exemplary embodiments of the invention. Modifications of the above disclosed apparatus and methods which fall within the scope of the invention will be readily apparent to those of ordinary skill in the art. Accordingly, although the present invention has been disclosed in connection with exemplary embodiments thereof, it should be understood that other embodiments may fall within the spirit and scope of the invention, as defined by the following claims.

The invention claimed is:

1. A method of forming a memory cell, the method comprising:
   forming a pillar above a substrate, the pillar comprising a steering element and a metal hardmask layer;
   selectively removing the metal hardmask layer to create a void; and
   forming a carbon-based switching material within the void.

2. The method of claim 1, wherein the metal hardmask layer comprises tungsten.

3. The method of claim 1, wherein selectively removing the metal hardmask layer comprises using hydrofluoric acid solution to remove the metal hardmask layer.

4. The method of claim 3, wherein the hydrofluoric acid solution comprises hydrofluoric acid and ozone.

5. The method of claim 4, wherein the hydrofluoric acid solution comprises about 0.05% Wt % hydrofluoric acid and 100-500 ppm gas phase ozone.

6. The method of claim 1, wherein the pillar is surrounded by a first dielectric material and the void is created within the first dielectric material by removal of the metal hardmask layer.

7. The method of claim 6, wherein the first dielectric material comprises silicon dioxide.

8. The method of claim 6, further comprising forming at least one sidewall liner within the void, the sidewall liner comprising a second dielectric material.

9. The method of claim 8, wherein the second dielectric material comprises conformal silicon dioxide or silicon nitride.

10. The method of claim 8, wherein forming the carbon-based switching material within the void comprises depositing carbon-based switching material over the sidewall liner and forming a planar surface that exposes the first dielectric material and the carbon-based switching material.

11. A memory cell formed using the method of claim 10.

12. The method of claim 1, wherein the steering element comprises a polysilicon diode.

13. The method of claim 1, wherein the carbon based switching material comprises graphene, graphite, amorphous carbon, carbon nanotube material, or amorphous diamond-like carbon.

14. A memory cell formed using the method of claim 1.

15. A method of forming a memory cell, the method comprising:
    forming a first conductor above a substrate;
    forming a pillar above first conductor, the pillar comprising a steering element and a metal hardmask layer;
    surrounding the pillar with a first dielectric material;
    selectively removing the metal hardmask layer to create a void in the first dielectric material;
    forming at least one sidewall liner within the void, the sidewall liner comprising a second dielectric material;
    forming a carbon-based switching material in the void;
    planarizing the substrate to expose both the first dielectric material and the carbon-based switching material; and
    forming a second conductor above the exposed first dielectric material and carbon-based switching material.

16. The method of claim 15, wherein the metal hardmask layer comprises tungsten.

17. The method of claim 15, wherein selectively removing the metal hardmask layer comprises using hydrofluoric acid solution to remove the metal hardmask layer.

18. The method of claim 17, wherein the hydrofluoric acid solution comprises hydrofluoric acid and ozone.

19. The method of claim 18, wherein the hydrofluoric acid solution comprises about 0.05% Wt % hydrofluoric acid and 100-500 ppm gas phase ozone.

20. The method of claim 15, wherein the first dielectric material comprises silicon dioxide.

21. The method of claim 15, wherein the second dielectric material comprises conformal silicon dioxide or silicon nitride.

22. The method of claim 15, wherein the steering element comprises a polysilicon diode.

23. A memory cell formed using the method of claim 15.

* * * * *